(12) United States Patent
Ranta

(10) Patent No.: US 11,290,087 B2
(45) Date of Patent: *Mar. 29, 2022

(54) POSITIVE LOGIC DIGITALLY TUNABLE CAPACITOR

(71) Applicant: pSemi Corporation, San Diego, CA (US)

(72) Inventor: Tero Tapio Ranta, San Diego, CA (US)

(73) Assignee: pSemi Corporation, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/653,728

(22) Filed: Oct. 15, 2019

(65) Prior Publication Data

US 2020/0119719 A1 Apr. 16, 2020

Related U.S. Application Data

(63) Continuation of application No. 15/871,643, filed on Jan. 15, 2018, now Pat. No. 10,476,484, which is a
(Continued)

(51) Int. Cl.
*H03K 17/687* (2006.01)
*H03J 3/20* (2006.01)
(Continued)

(52) U.S. Cl.
CPC .................................. *H03J 3/16* (2013.01); *H03J 3/20* (2013.01); *H03J 5/24* (2013.01); *H03K 17/687* (2013.01);
(Continued)

(58) Field of Classification Search
CPC ........ H03M 1/1061; H03M 1/804; H03J 3/20; H03J 3/16; H03J 5/24
See application file for complete search history.

(56) References Cited

U.S. PATENT DOCUMENTS 4,893,070 A 1/1990 Milberger et al.
5,012,123 A 4/1991 Ayasli et al.
(Continued)

FOREIGN PATENT DOCUMENTS

WO 2008133621 11/2008
WO 2009108391 9/2009

OTHER PUBLICATIONS

Copenheaver, Blaine, International Search Report and Written Opinion received from the USRO dated May 27, 2009, 11 pgs.
(Continued)

*Primary Examiner* — Patrick C Chen
(74) *Attorney, Agent, or Firm* — Jaquez Land Greenhaus & McFarland LLP; Alessandro Steinfl, Esq.

(57) ABSTRACT

Methods and devices providing Positive Logic biasing schemes for use in a digitally tuning capacitor in an integrated circuit device are described. The described methods can be used in integrated circuits with stringent requirements in terms of switching time, power handling, noise sensitivity and power consumption. The described devices include DC blocking capacitors arranged in series with stacked switches coupled to RF nodes. The stacked FET switches receive non-negative supply voltages through their drains and gates during the ON and OFF states to adjust the capacitance between the two nodes.

17 Claims, 9 Drawing Sheets

Related U.S. Application Data continuation of application No. 15/256,453, filed on Sep. 2, 2016, now Pat. No. 9,948,281.

(51) Int. Cl.
*H03J 5/24* (2006.01)
*H03J 3/16* (2006.01)

(52) U.S. Cl.
CPC ............... *H03B 2201/0208* (2013.01); *H03B 2201/0266* (2013.01)

(56) References Cited

U.S. PATENT DOCUMENTS

| | | | |
|---|---|---|---|
| 5,382,826 | A | 1/1995 | Mojaradi et al. |
| 6,683,499 | B2 | 1/2004 | Lautzenhiser et al. |
| 6,747,522 | B2 | 6/2004 | Pietruszynski et al. |
| 6,753,738 | B1 | 6/2004 | Baird |
| 6,803,680 | B2 | 10/2004 | Brindle et al. |
| 6,804,502 | B2 | 10/2004 | Burgener et al. |
| 6,889,036 | B2 | 5/2005 | Ballweber et al. |
| 6,906,653 | B2 | 6/2005 | Uno |
| 7,098,755 | B2 | 8/2006 | Zhao et al. |
| 7,190,933 | B2 | 3/2007 | De Ruijter et al. |
| 7,299,018 | B2 | 11/2007 | Van Rumpt |
| 7,459,988 | B1 | 12/2008 | Iversen |
| 7,492,209 | B2 | 2/2009 | Prikhodko et al. |
| 7,492,238 | B2 | 2/2009 | Nakatsuka et al. |
| 7,825,715 | B1 | 11/2010 | Greenberg |
| 7,910,993 | B2 | 3/2011 | Brindle et al. |
| 7,960,772 | B2 | 6/2011 | Englekirk |
| 8,044,739 | B2 | 10/2011 | Rangarajan et al. |
| 8,334,718 | B2 | 12/2012 | Granger-Jones et al. |
| 8,373,490 | B2 | 2/2013 | Burgener et al. |
| 8,461,903 | B1 | 6/2013 | Granger-Jones |
| 8,587,361 | B2 | 11/2013 | Taddiken et al. |
| 8,669,804 | B2 | 3/2014 | Ranta et al. |
| 8,970,278 | B2 | 3/2015 | Granger-Jones et al. |
| 9,024,700 | B2 | 5/2015 | Ranta |
| 9,106,227 | B2 | 8/2015 | Ranta et al. |
| 9,190,994 | B2 | 11/2015 | Hurwitz |
| 9,209,801 | B2 | 12/2015 | Matsuno |
| 9,276,570 | B2 | 3/2016 | Madan et al. |
| 9,667,244 | B1 | 5/2017 | Cavus et al. |
| 9,742,400 | B2 | 8/2017 | Bakalski et al. |
| 9,948,281 | B2 | 4/2018 | Ranta |
| 10,050,616 | B2 | 8/2018 | Ranta et al. |
| 10,158,285 | B2 | 12/2018 | Emsenhuber |
| 10,270,437 | B2 | 4/2019 | Scott et al. |
| 10,320,379 | B2 | 6/2019 | Kerr et al. |
| 10,476,484 | B2 | 11/2019 | Ranta |
| 10,505,530 | B2 | 12/2019 | Ranta et al. |
| 10,523,195 | B1 | 12/2019 | Luo et al. |
| 10,630,280 | B2 | 4/2020 | Willard et al. |
| 10,886,911 | B2 | 1/2021 | Willard et al. |
| 11,018,662 | B2 | 5/2021 | Willard et al. |
| 2002/0120103 | A1 | 8/2002 | Rosen et al. |
| 2003/0090313 | A1 | 5/2003 | Burgener et al. |
| 2005/0017789 | A1 | 1/2005 | Burgener et al. |
| 2005/0068103 | A1 | 3/2005 | Dupuis et al. |
| 2005/0151575 | A1 | 7/2005 | Sibrai et al. |
| 2005/0179506 | A1 | 8/2005 | Takahashi et al. |
| 2005/0285684 | A1 | 12/2005 | Burgener et al. |
| 2005/0287976 | A1 | 12/2005 | Burgener et al. |
| 2006/0077082 | A1 | 4/2006 | Shanks et al. |
| 2006/0160520 | A1 | 7/2006 | Naoyuki |
| 2006/0194567 | A1 | 8/2006 | Kelly et al. |
| 2006/0270367 | A1 | 11/2006 | Burgener et al. |
| 2007/0018247 | A1 | 1/2007 | Brindle et al. |
| 2007/0120103 | A1 | 5/2007 | Burgener et al. |
| 2008/0265978 | A1 | 10/2008 | Englekirk |
| 2009/0224843 | A1 | 9/2009 | Radoias et al. |
| 2010/0060377 | A1 | 3/2010 | Takahashi |
| 2010/0308932 | A1* | 12/2010 | Rangarajan .......... H03B 5/1265 331/167 |
| 2011/0002080 | A1* | 1/2011 | Ranta ................... H03M 1/1061 361/277 |
| 2011/0127849 | A1* | 6/2011 | Yoon ........................ H03J 3/20 307/109 |
| 2011/0227666 | A1 | 9/2011 | Manssen et al. |
| 2013/0015717 | A1 | 1/2013 | Dykstra |
| 2014/0009214 | A1 | 1/2014 | Altunkilic et al. |
| 2014/0055191 | A1* | 2/2014 | Kim ..................... H03K 17/687 327/427 |
| 2014/0368257 | A1* | 12/2014 | Wang .................. H03K 17/102 327/434 |
| 2015/0364928 | A1 | 12/2015 | Yen et al. |
| 2015/0381171 | A1 | 12/2015 | Cebi et al. |
| 2016/0329891 | A1 | 11/2016 | Bakalski et al. |
| 2017/0201248 | A1 | 7/2017 | Scott et al. |
| 2017/0272066 | A1 | 9/2017 | Scott et al. |
| 2017/0338321 | A1 | 11/2017 | Hurwitz et al. |
| 2018/0069530 | A1 | 3/2018 | Ranta et al. |
| 2018/0114801 | A1 | 4/2018 | Leipold et al. |
| 2018/0159511 | A1 | 6/2018 | Ranta |
| 2018/0175851 | A1 | 6/2018 | Kerr et al. |
| 2020/0153425 | A1 | 5/2020 | Ranta et al. |
| 2020/0321955 | A1 | 10/2020 | Willard et al. |

OTHER PUBLICATIONS

Peregrine Semiconductor Corporation, Article 19 Amendment Letter under Seciton 205(b) and Rule 46.5 (b) PCT filed in the International Bureau of WIPO dated Aug. 11, 2009 for appln. No. PCT/US2009/001358.
Dang, Hung Q., Office Action received from the USPTO dated Dec. 22, 2011 for U.S. Appl. No. 12/735,954, 32 pgs.
Ranta, Tero Tapio, Amendment filed in the USPTO dated Mar. 21, 2012 for U.S. Appl. No. 12/735,954, 16 pgs.
Dang, Hung Q., Notice of Allowance received from the USPTO dated Jul. 12, 2012 for U.S. Appl. No. 12/735,954, 20 pgs.
Dang, Hung Q., Notice of Allowance received from the USPTO dated Oct. 1, 2012 for U.S. Appl. No. 12/735,954, 67 pgs.
Ranta, Tero Tapio, Amendment filed in the USPTO dated Jun. 26, 2014 for U.S. Appl. No. 12/735,954, 33 pgs.
Dang, Hung Q., Notice of Allowance received from the USPTO dated Jan. 25, 2013 for U.S. Appl. No. 12/735,954, 42 pgs.
Dang, Hung Q., Notice of Allowance received from the USPTO dated May 10, 2013 for U.S. Appl. No. 12/735,954, 22 pgs.
Dang, Hung Q., Notice of Allowance received from the USPTO dated Sep. 13, 2013 for U.S. Appl. No. 12/735,954, 16 pgs.
Ranta, Tero Tapio, Amendment filed in the USPTO dated Dec. 13, 2013 for U.S. Appl. No. 12/735,954, 29 pgs.
Dang, Hung Q., Office Action received from the USPTO dated Feb. 26, 2014 for U.S. Appl. No. 12/735,954, 34 pgs.
Dang, Hung Q., Notice of Allowance received from the USPTO dated Nov. 18, 2014 for U.S. Appl. No. 12/735,954, 33 pgs.
Kao, W.H., et al., "Parasitic extraction: current state of the art and future trends", Proceedings of the IEEE, May 2001, vol. 89, Issue 5, pp. 729-739.
Brambilla, A., et al., "Measurements and extractions of parasitic capacitances in ULSI layouts", Electron Devices, IEEE Transactions, Nov. 2003, vol. 50, Issue 11, pp. 2236-2247.
Xu, et al., "An efficient formulation for substrate parasitic extraction accounting for nonuniform current distribution", Circuits and Systems I: Regular papers, IEEE Transactions, Jun. 2004, vol. 51, Issue 6, pp. 1223-1233.
Nabors, et al., "FastCap: A Multipole Accelerated 3-D Capacitance Extraction Program", IEEE Transactions on Computer Aided Design, vol. 10, No. 11, Nov. 1991, pp. 1447-1459.
Nabors, et al., "Fast Capacitance Extraction of General Three-Dimensional Structures", IEEE Transactions on Microwave Theory and Techniques, vol. 40, No. 7, Jul. 1992, pp. 1496-1506.
Nabors, et al., "Multipole-Accelerated Capacitance Extraction Algorithms for 3-D Structures with Multiple Dielectrics" IEEE Transactions on Circuit and Systems, 1: Fundamental Theory and Applications, vol. 39, No. 11, Nov. 1992, pp. 946-954.

(56) References Cited

OTHER PUBLICATIONS

Tausch, et al., "Capacitance Extraction of 3-D Conductor Systems in Dielectric Media with High-Permittivity Ratios", IEEE Transactions on Microwave Theory and Techniques, vol. 47, No. 1, Jan. 1999, pp. 18-26.
Nabors, et al., "A Fast Multipole Algorithm for Capacitance Extraction of Complex 3-D Geometries", IEEE 1989 Custom Integrated Circuits Conference, May 1989, pp. 21.7.1-21.7.4.
Nabors, et al., "Fast Capacitance Extraction of General Three-Dimensional Structures", Proc. Int. Conf. on Computer Design, Cambridge, MA, Oct. 1991, pp. 479-484.
Nabors, et al., "Including Conformal Dielectrics in Multipole-Accelerated Three-Dimensional Interconnect Capacitance Extraction", proceedings of NUPAD IV, Seattle, WA, May 1992, 2 pgs.
Nabors, et al., "Multipole-Accelerated 3-D Capacitance Extraction Algorithms for Structures with Conformal Dielectrics", Proceeding of the 29th Design Automation Conference, Anaheim, CA, Jun. 1992, pp. 710-715.
Phillips, et al., "A Precorrected-FFT method for Capacitance Extraction of Complicated 3-D Structures", Int. Conf. on Computer-Aided Design, Santa Clara, CA, Nov. 1994, 4 pgs.
Phillips, et al., "Efficient Capacitance Extraction of 3D Structures Using Generalized Pre-Corrected FFT Methods", Proceedings of the IEEE 3rd Tropical Meeting on Electrical Performance of Electronic Packaging, Monterey, CA, Nov. 1994, 3 pgs.
Cai, et al., "Efficient Galerkin Techniques for Multipole-Accelerated Capacitance Extraction of 3-D Structures with Multiple Dielectrics" Proceedings of the 16th Conference on Advanced Research in VLSI, Chapel Hill, North Carolina, Mar. 1995, 12 pages.
Kamon, et al., "FastPep: A Fast Parasitic Extraction Program for Complex Three-Dimensional Geometries", Proceedings of the IEEE Conference on Computer-Aided Design, San Jose, Nov. 1997, pp. 456-460.
Young, Lee W., International Search Report received from USRO for related appln. No. PCT/US2007/10331 dated Feb. 15, 2008, 14 pages.
Patel, Reema, Notice of Allowance received from the USPTO for related U.S. Appl. No. 11/796,522, dated Jan. 28, 2011, 9 pgs.
Le, Dinh Thanh, Office Action received from the USPTO dated Jun. 23, 2011 for related U.S. Appl. No. 12/803,064, 16 pgs.
Brosa, Anna-Maria, extended European Search Report received from the EPO dated Jul. 15, 2011 for related application No. 09715932.1, 12 pgs.
Le, Dinh Thanh, Office Action received from the USPTO dated Dec. 1, 2011 for related U.S. Appl. No. 12/803,064, 23 pgs.
Patel, Reema, Office Action received from the USPTO dated Dec. 5, 2011 for related U.S. Appl. No. 13/046,560, 13 pgs.
Peregrine Semiconductor Corporation, Response filed in the EPO dated Feb. 10, 2012 for related appln. No. 09715932.1, 47 pgs.
Cole, Brandon S., Office Action received from the USPTO dated Feb. 24, 2012 for related U.S. Appl. No. 12/803,133, 36 pgs.
Kurisu, Masakazu, Japanese Office Action and translation received from the JPO dated Apr. 17, 2012 for related appln. No. 2010-506156, 4 pgs.
Ranta, et al., Amendment filed in USPTO dated Apr. 30, 2012 for related U.S. Appl. No. 12/803,064, 16 pgs.
Ranta, et al., Response filed in the USPTO dated May 23, 2012 for related U.S. Appl. No. 12/803,133, 7 pgs.
Patel, Reema, Notice of Allowance received from the USPTO dated May 24, 2012 for related appln. No. 13/046,560, 15 pgs.
Englekirk, Robert Mark, Amendment filed in the USPTO dated Mar. 5, 2012 for related U.S. Appl. No. 13/046,560, 4 pgs.
Cole, Brandon S., Notice of Allowance received from the USPTO dated Jun. 8, 2012 for related U.S. Appl. No. 12/803,133, 12 pgs.
Le, Dinh Thanh, Office Action received from the USPTO dated Jun. 13, 2012 for related U.S. Appl. No. 12/803,064, 14 pgs.
Theunissen, Lars, Communication under Rule 71(3) EPC dated Jul. 2, 2012 for related appln. No. 09715932.1, 98 pgs.

Ranta, et al., Comments on Examiner's Statement of Reasons for Allowance filed in the USPTO dated Sep. 10, 2012 for related U.S. Appl. No. 12/803,133, 3 pgs.
Ranta, et al., Amendment filed in the USPTO dated Sep. 12, 2012 for related U.S. Appl. No. 12/803,064, 13 pgs.
Chen, Patrick C., Office Action received from the USPTO dated Apr. 4, 2017 for U.S. Appl. No. 15/256,453, 6 pgs.
Chen, Patrick C., Office Action received from the USPTO dated May 25, 2017 for U.S. Appl. No. 15/256,453, 11 pgs.
Chen, Patrick C., Notice of Allowance received from the USPTO dated Dec. 15, 2017 for U.S. Appl. No. 15/256,453, 11 pgs.
Ranta, Tero Tapio, Response filed in the USPTO dated Apr. 14, 2017 for U.S. Appl. No. 15/256,453, 3 pgs.
Ranta, Tero Tapio, Response filed in the USPTO dated Aug. 24, 2017 for U.S. Appl. No. 15/256,453, 11 pgs.
Chen, Patrick C., Office Action received from the USPTO dated May 1, 2018 for U.S. Appl. No. 15/871,643, 18 pgs.
Chen, Patrick C., Applicant-Initiated Interview Summary received from the USPTO dated Jun. 20, 2018 for U.S. Appl. No. 115/871,643, 3 pgs.
Chen, Patrick C., Final Office Action received from the USPTO dated Dec. 13, 2018 for U.S. Appl. No. 15/871,643, 24 pgs.
Chen, Patrick C., Advisory Action received from the USPTO dated May 8, 2019 for U.S. Appl. No. 15/871,643, 3 pgs.
Chen, Patrick C., Applicant-Initiated Interview Summary received from the USPTO dated May 8, 2019 for U.S. Appl. No. 15/871,643, 2 pgs.
Chen, Patrick C., Notice of Allowance received from the USPTO dated Jul. 3, 2019 for U.S. Appl. No. 15/871,643, 8 pgs.
Chen, Patrick C., Notice to File Corrected Application Papers received from the USPTO dated Sep. 5, 2019 for U.S. Appl. No. 15/871,643, 3 pgs.
PSEMI Corporation. Amendment After Allowance filed in the USPTO dated Sep. 12, 2019 for U.S. Appl. No. 15/871,643, 3 pgs.
Chen, Patrick C., Reply to Applicant-Initiated Interview Summary filed in the USPTO dated May 9, 2019 for U.S. Appl. No. 15/871,643, 2 pgs.
Chen, Patrick C., Response filed in the USPTO dated Apr. 10, 2019 for U.S. Appl. No. 15/871,643, 13 pgs.
Chen, Patrick C., Response filed in the USPTO dated Jun. 19, 2018 for U.S. Appl. No. 15/871,643, 14 pgs.
Chen, Patrick C., Preliminary Amendment filed in the USPTO dated Feb. 23, 2018 for U.S. Appl. No. 15/871,643, 6 pgs.
Wells, Kenneth B., Office Action received from the USPTO dated Sep. 4, 2019 for U.S. Appl. No. 16/261,167, 31 pgs.
Fermentel, Thomas, International Search Report and Written Opinion received from the EPO dated Jan. 8, 2020 for appln. No. PCT/US2019/024143, 19 pgs.
Wells, Kenneth B., Final Office Action received from the USPTO dated Jan. 28, 2020 for U.S. Appl. No. 16/261,167, 25 pgs.
Wells, Kenneth, Notice of Allowance received from the USPTO dated Feb. 28, 2020 for U.S. Appl. No. 16/261,167, 11 pgs.
Tra, Anh Quan, Office Action received from the USPTO dated Mar. 20, 2020 for U.S. Appl. No. 15/939,132, 11 pgs.
Wells, Kenneth, Office Action received from the USPTO dated Apr. 22, 2020 for U.S. Appl. No. 16/682,920, 154 pgs.
Tra, Anh Quan, Final Office Action received from the USPTO dated Jul. 2, 2020 for U.S. Appl. No. 15/939,132, 15 pgs.
Tra, Anh Quan, Advisory Action received from the USPTO dated Sep. 11, 2020 for U.S. Appl. No. 15/939,132, 3 pgs.
Wells, Kenneth, Final Office Action received from the USPTO dated Jul. 29, 2020 for U.S. Appl. No. 16/682,920, 20 pgs.
Wells, Kenneth, Notice of Allowance received from the USPTO dated Sep. 10, 2020 for U.S. Appl. No. 16/682,920, 7 pgs.
Wells, Kenneth B., Notice of Allowance received from the USPTO dated Jan. 26, 2021 for U.S. Appl. No. 16/852,804, 9 pgs.
Wells, Kenneth B., Office Action received from the USPTO dated Oct. 16, 2020 for U.S. Appl. No. 16/852,804, 220 pgs.

* cited by examiner

POSITIVE LOGIC DIGITALLY TUNABLE CAPACITOR

CROSS REFERENCE TO RELATED APPLICATIONS—CLAIM OF PRIORITY

This application is a continuation of, and claims the benefit of priority under 35 USC § 120 of, commonly assigned and co-pending prior U.S. application Ser. No. 15/871,643, filed Jan. 15, 2018, "Positive Logic Digitally Tunable Capacitor", the disclosure of which is incorporated herein by reference in its entirety. Application Ser. No. 15/871,643 is a continuation of, and claims the benefit of priority under 35 USC § 120 of, commonly assigned pending prior U.S. application Ser. No. 15/256,453, filed Sep. 2, 2016, "Positive Logic Digitally Tunable Capacitor", now U.S. Pat. No. 9,948,281, issued Apr. 17, 2018, the disclosure of which is incorporated herein by reference in its entirety. Application Ser. No. 15/256,453 is related to PCT Patent International Application No. PCT/US2009/001358 filed Mar. 2, 2009, entitled "Method and Apparatus for use in Digitally Tuning a Capacitor in an Integrated Circuit Device" incorporated herein by reference in its entirety. This application is also related to U.S. application Ser. No. 12/803,139 filed Jun. 18, 2010, entitled "Device and Methods for Improving Voltage handling and/or Bi-directionality of Stacks of Elements when Connected Between Terminals", issued as U.S. Pat. No. 8,669,804 on Mar. 11, 2014, also incorporated herein by reference in its entirety.

TECHNICAL FIELD

The present disclosure relates to integrated circuit devices, and more particularly to a method and apparatus for digitally tuning the capacitance of integrated circuit components in integrated circuit devices that use positive logic for DC biasing purpose.

SUMMARY

According to a first aspect of the present disclosure, an integrated circuit block is provided, comprising: a first node; a second node; a resistive network, and a series arrangement of two or more capacitors and a plurality of FET switches coupled between the first node and the second node; wherein: a first capacitor of the two or more capacitors is coupled to the first node and a second capacitor of the two or more capacitors is coupled to the second node; the plurality of FET switches comprises a first end FET switch and a second end FET switch, the first end FET switch being closest to the first node and farthest from the second node and the second end FET switch being closest to the second node and farthest from the first node; each FET switch comprises a gate resistor connecting a FET switch gate to a first supply voltage; the resistive network comprises a plurality of resistive paths connecting a second supply voltage to drains of corresponding FET switches; the resistive network further comprises a resistive path connecting the second supply voltage to a source of the second end FET switch, and wherein the first supply voltage and the second supply voltage are configured to enable or disable the FET switches and thereby adjusting the capacitance between the two nodes.

According to a second aspect of the present disclosure, a method for digitally tuning a capacitor in an integrated circuit is disclosed, providing: providing a first node; providing a second node; providing a series arrangement of two or more capacitors and a plurality of FET switches; the plurality of FET switches comprising a first end FET switch and a second end FET switch, the first end FET switch being the closest to the first node and farthest from the second node and the second end FET switch being closest to the second node and farthest from the first node, and each of the plurality of FET switches comprising a gate resistor; providing a resistive network, the resistive network comprising: a plurality of resistive paths connecting a second supply voltage to drains of corresponding FET switches of the plurality of FET switches; a resistive path connecting the second supply voltage to a source of the end FET switch; connecting each of the FET switches from the plurality of the FET switches to a first supply voltage via a corresponding gate resistor; coupling the series arrangement of two or more capacitors and the plurality of FET switches between the first node and the second node; coupling a first capacitor of the two or more capacitors to the first node and coupling a second capacitor of the two or more capacitors to the second node, and enabling or disabling the FET switches using the first supply voltage and the second supply voltage and thereby adjusting the capacitance between the two nodes.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION OF THE INVENTION

Figure 1:
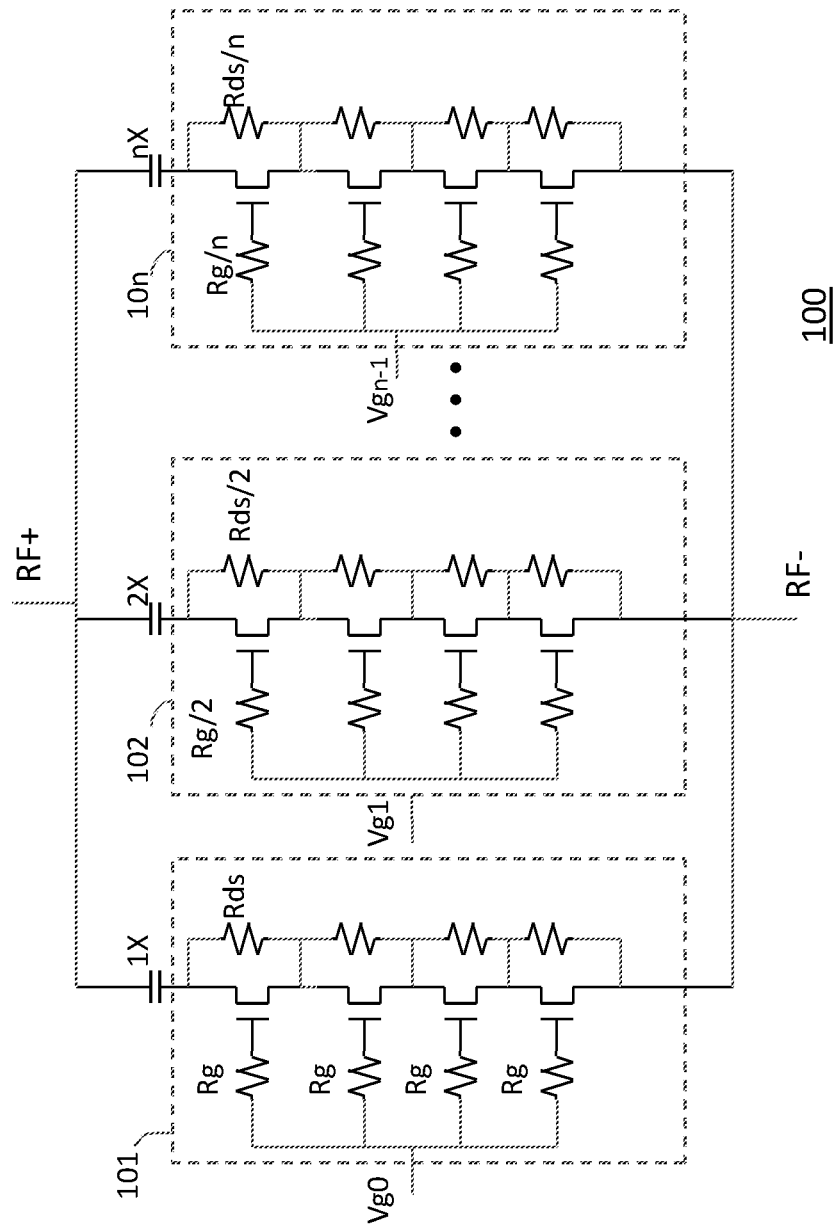
FIG. 1 shows an example of a digitally tunable capacitor circuit as disclosed in PCT Patent Application PCT/US2009/001358 incorporated herein by reference in its entirety.

FIG. 1 shows an example of a digitally tuned capacitor (hereafter, "DTC") circuit as disclosed in PCT Patent Application PCT/US2009/001358 incorporated herein by reference in its entirety. The circuit of FIG. 1 comprises a plurality of sub-circuits 101, 102, . . . , 10n, configured in parallel. Each sub-circuit comprises a plurality of stacked switching FETs coupled in series with their associated capacitance. A standard biasing scheme is usually used in this type of circuit wherein a positive voltage (applied to the gate of each FET) is applied to turn the stack ON and a negative voltage (applied to the gate of each FET) is used to turn the stack OFF. By way of example, a positive DC voltage of +3 volts may be applied (through the resistors Rg) to the gates of each FET in the sub-circuit 101 to turn the stack ON and a negative DC voltage of −3 volts may be applied (through the resistors Rg) to the gates of each FET in the sub-circuit 101 to turn the stack OFF.

In order to achieve an improved RF performance in designs using the above mentioned DTC, a large enough negative voltage to turn fully the FET switch OFF is highly desirable. Turning the FET switches into a full OFF state results in improved RF linearity in terms of harmonics and Inter Modulation Distortion (IMD), better RF power handling and also higher isolation.

In most applications using such DTC circuit as shown in FIG. 1, a positive supply voltage is readily available externally. However, the negative supply voltage is usually generated on-chip using a bias generator. The bias generator may conventionally use one or more charge pumps and voltage regulators.

On the other hand, there are applications where generating a negative supply voltage is either not desired or not practical due to design constraints. More in particular, in many applications a use of a negative charge pump is not even possible. These are applications with stringent requirements such as extremely low current and power consumption, extremely low noise sensitivity and very small die areas. Moreover, in biasing schemes wherein charge pumps are used to generate negative supply power, the switching speed is limited by current sourcing capability of the charge pumps. This is the main reason charge pumps cannot be used when designing integrated circuits requiring very fast switching times.

Embodiments of the present disclosure offer solutions for integrated circuits comprising DTC's wherein conventional designs to generate a negative supply voltage (e.g. charge pumps) are either impractical or impossible due to stringent system design requirements.

Figure 2A:
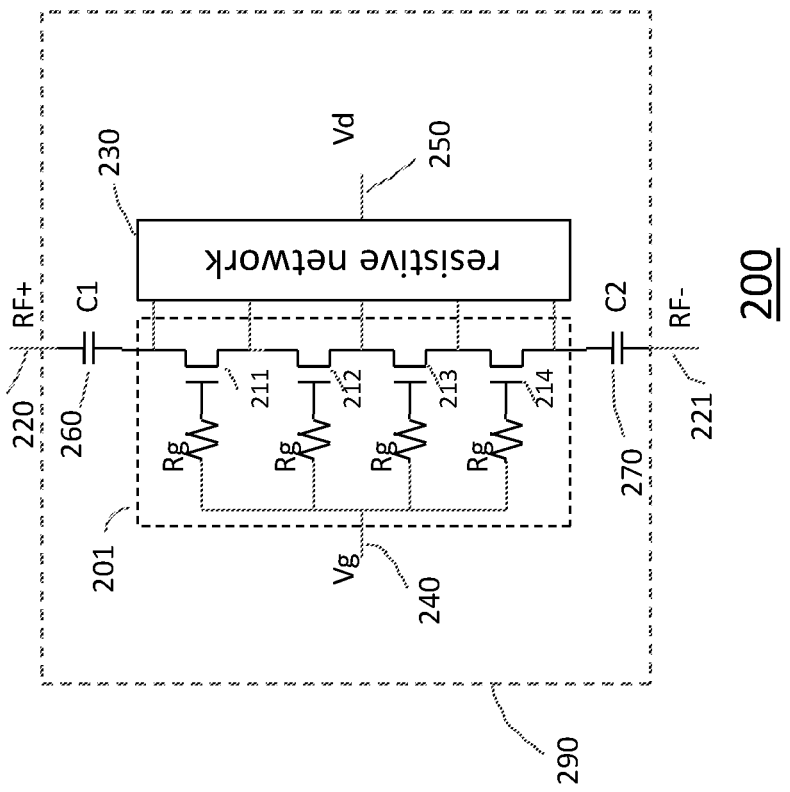
FIGS. 2A-2D show integrated circuit blocks comprising resistive networks in accordance with embodiments of the present disclosure.

FIG. 2A shows an integrated circuit block 200 according to an embodiment of the present disclosure. The integrated circuit block 200 comprises a circuit block 290 coupled to two nodes RF+ (220) and RF− (221). The circuit block 290 comprises a sub-circuit 201 that is analogous to any of the sub-circuits (e.g., 101, 102, . . . and 10n) as shown in FIG. 1. The sub-circuit 201 comprises a plurality of stacked FET switches (e.g., FETs 211, 212, 213 and 214). As also shown in FIG. 2A, the circuit block 290 comprises two capacitors C1 (260) and C2 (270) connected in series with the sub-circuit 201. More in particular, the capacitor C1 is close to a top end of the sub-circuit 201 and the capacitor C2 is close to a bottom end of the sub-circuit 201 in accordance with the current embodiment of the present disclosure. In addition to providing desired capacitance values to the DTC, the capacitors C1 and C2 are used for DC isolation purpose in accordance to an embodiment of the present teaching. In other words and from DC stand point, the capacitors C1 and C2 isolate the sub-circuit 201 from the node RF+ (220) and the node RF− (221) respectively.

Referring to FIG. 2A, the integrated circuit block 200 further comprises two supply voltages Vg (240) and Vd (250). In an operative condition, the two supply voltages Vg and Vd are used to enable or disable the switching stacks of FETs. The integrated circuit block 200 shown in FIG. 2 further comprises a resistive network 230. The resistive network 230 comprises a plurality of resistive paths that are used to connect the supply voltage Vd to drains of corresponding FET switches in accordance with an embodiment of the present disclosure. Furthermore, the resistive network 230 provides also a resistive path from the supply voltage Vd to a source terminal of a FET switch that is the closest to the capacitor C2 (e.g., switch FET 214 as shown in FIG. 2). In accordance with an embodiment of the present disclosure, the supply voltages Vg and Vd provide non-negative voltage levels. In other words and as described in more detail below, a combination of the non-negative supply voltages Vd and Vg provides a Positive Logic biasing scheme (they supply either a positive or 0 voltage) wherein a required voltages across a gate-source terminals of FET switches to enable or disable the switch stack is provided and therefore, the capacitance between the nodes 220 and 221 is adjusted. According to a further embodiment of the disclosure, the switch FETs are manufactured symmetrically, meaning that their source and drain can be interchanged without affecting the principal of operations as described in the present teachings.

In what follows, embodiments showing more details of the resistive network (230) will be described.

Figure 2B:
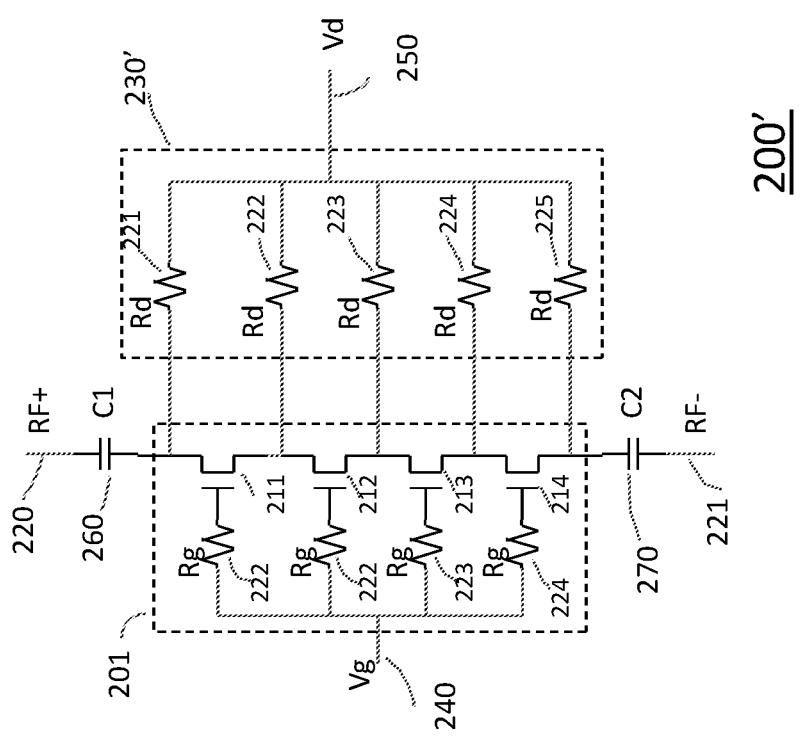

FIG. 2B shows another embodiment of an integrated circuit block 200' made in accordance with the present teachings. The integrated circuit block 200' comprises a resistor network 230' comprising a plurality of resistors Rd (e.g., resistors 221-225). Each resistor Rd connects the non-negative supply voltage Vd to a drain terminal of a corresponding FET in the switch stack. Moreover, a source terminal of the switching FET that is the closest to the capacitor C2 (e.g., FET 214) is connected to the supply voltage Vd through the resistor 224. Also shown in FIG. 2B are gate resistors Rg, each connecting the supply voltage Vg to a corresponding gate terminal of the FET stack.

Further referring to FIG. 2B and by way of example, the FET stacks are turned ON by applying a positive voltage (e.g. +3V) to the FET gates (via Rg's), while applying 0V to the FET drains (via Rd's). This effectively creates a positive DC gate to source voltage Vgs for every FET in the stack (i.e. gate voltage is +3V with respect to the source terminal). Correspondingly, the FET stacks are turned OFF by applying 0V to the FET gates (via Rg's), while applying a positive voltage (e.g. +3V) to the drain (via Rd's). This effectively creates a negative DC Vgs for every FET in the stack (i.e. gate voltage is −3V with respect to source terminal). Note that obtaining a negative voltage Vgs as described in the OFF state, is mainly by virtue of DC blocking provided by the capacitors C1 (260) and C2 (270). In other words, since drain DC voltages across the stack are non-zero in the OFF state, the DC blocking capacitors 260 and 270 are used on both ends of the stack to achieve the required gate-source voltage levels in both ON and OFF states. In the described example, the supply voltages Vg and Vd are inverted versions of each other. In other words, when Vg is high (e.g., +3V) Vd is low (e.g., 0V) and vice versa. Although in an embodiment based on the described example, the supply voltages Vd and Vg are inverted versions of each other, the person skilled in the Art will understand that other embodiments may be envisaged wherein the supply voltages Vd and Vg do not switch at the same time and/or are not inverted versions of each other. In another embodiment of the disclosure, the drain terminals of the switching stack is biased at a fixed voltage. This can be accomplished by providing a constant mid-rail voltage (e.g., +1.5V) as Vd. Similar to the previous example, when Vg is high (e.g., +3V) a positive voltage of +1.5V will appear across the gate-source of each switch FET and the switches are ON, and when Vg is low (e.g., 0V) a negative voltage of −1.5V will appear across the gate-source of each FET switch and as a result, the switch stack will be OFF. In this biasing scheme, lower or higher voltages may also be used (e.g., +0.5V) for Vd. In a further embodiment of the disclosure, the fixed mid-rail voltage may be chosen based on the threshold voltage, Vt, of the FETs to provide the same amount of gate overdrive (Vgs−Vt) in both ON and OFF states. It is emphasized that a negative voltage is not used in the described biasing scheme and therefore design of integrated circuits requiring very fast switching time is made possible through the teaching of the present disclosure. In a design based on the prior art, a conventional method (e.g., charge pump) is required to generate a negative bias and as a result, the integrated circuit speed will be limited to the speed of charge pump when sourcing current. Moreover, in a typical design based on prior art, a supply voltage analogous to the supply voltage Vg of FIG. 2B, needs to be pulled down to 0V, then down to −3V to turn off a corresponding FET switch. However, continuing with the same example, the two supply voltages Vd and Vg may only change by half of a voltage change just described to make the switching happen. In other words, the supply voltage Vg may go from 3V to 0V while the supply voltage Vd may go up simultaneously. This results in a further improvement in switching time compared to typical designs of prior Art as mentioned above, Referring to FIG. 2B, supplying a large level of positive voltage to a gate-source or gate-drain junction when turning the FET switch ON, will reduce the ON resistance, Ron, of the FET switch. This results in lower RF loss. On the other hand, applying a large level of negative voltage to turn OFF the FET switch improves the linearity and harmonics performance of the FETs. These are the main reasons why it is desired to drive the FETs as hard as possible when turning them ON and OFF. In other words, as long as the applied voltages stay safely below the breakdown voltages or safe operating voltages across various terminals of the FET switches, it is preferred to apply the maximum allowable voltage across the gate-source terminals of the switching FETs when enabling and disabling them. In a preferred embodiment, Vd and Vg are chosen so that maximum allowable voltages are applied to the stack to turn the switches ON and OFF. The person skilled in the art will understand that other design choices for Vd and Vg are also possible.

With further reference to FIG. 2B, the person skilled in the art will appreciate that, regardless of the switching stack state and except for the FETs' leakage currents, the integrated circuit block 200' and the generation of the bias voltages does not consume any DC power. This is very beneficial for integrated circuits with stringent power or current consumption requirements. A preferred embodiment of the present disclosure uses the existing supply rail to provide Vd and Vg. However, the person skilled in the art will understand that other design choices to provide Vd and Vg may be envisaged.

Although in the preferred embodiment of FIG. 2B the gate resistors Rg are equal in size and the drain resistors Rd are all equal in size, the person skilled in the art will understand that other embodiments may comprise gate resistors and drain resistors of different sizes. Similarly, the capacitors C1 and C2 may have same or different capacitances as used in various embodiments of the present disclosure. Although in a preferred embodiment of the disclosure, a bias voltage is applied evenly to every drain terminal in the FET stack, the person skilled in the art will also understand that other implementations applying uneven bias voltages to drain terminals of the switching FETs may also be envisaged. Referring to FIG. 2B, a function of the resistors Rd and Rg is to isolate the RF signal from the DC circuitry. The size of the resistors Rg and Rd are desired to be as large as possible as long as switching requirements and die area constraints are met. These resistors de-Q (lower the Q) the capacitance of switching FETs when the switch is OFF, and de-Q the capacitors C1 and C2 in both states and therefore a larger size is preferred to achieve a higher Q for the DTC Referring to the embodiments disclosed in the present disclosure, all the design rules, guidelines as well as the related tradeoffs as disclosed in the PCT Patent International Application No. PCT/US2009/001358 filed Mar. 2, 2009, entitled "Method and Apparatus for use in Digitally Tuning a Capacitor in an Integrated Circuit Device" incorporated herein by reference in its entirety, remain applicable to the embodiments described herein with reference to the present disclosure. By way of example, the ON resistance, OFF capacitance, stack height, capacitor values, Rg and Rd values may be appropriately selected using the teachings as disclosed in the above-incorporated patents. Additionally, the person skilled in the art will understand that, after minor modifications and proper adjustments, all the equations as described in the above-incorporated patent will be applicable to the embodiments of the present disclosure.

Figure 2C:
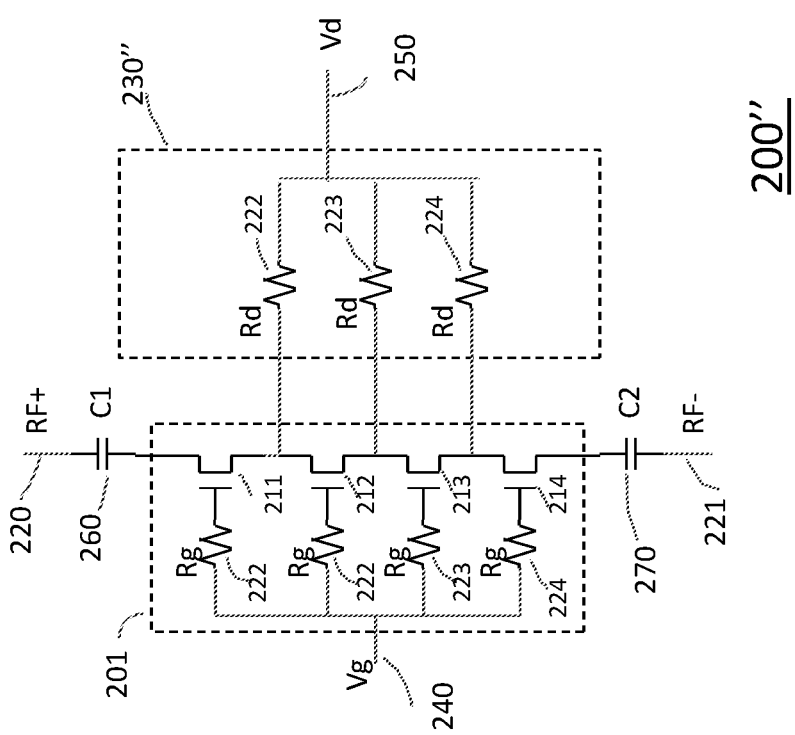

Further referring to FIG. 2B, embodiments in accordance with the disclosure wherein the supply voltage is connected to the drains or sources of only some of the FET switches (and not all) are also possible. For example, FIG. 2C shows an integrated circuit block 200" in accordance with another embodiment of the disclosure. The resistive network 230" is similar to the resistive network 230' with an exception that the supply voltage is neither connected to the drain terminal of the switch on the top end of the stack nor to the source terminal of the switch on the bottom end of the stack. The principal of operation of the integrated circuit block 230" remains the same as that of the integrated circuit block 230' shown in FIG. 2B.

Figure 2D:
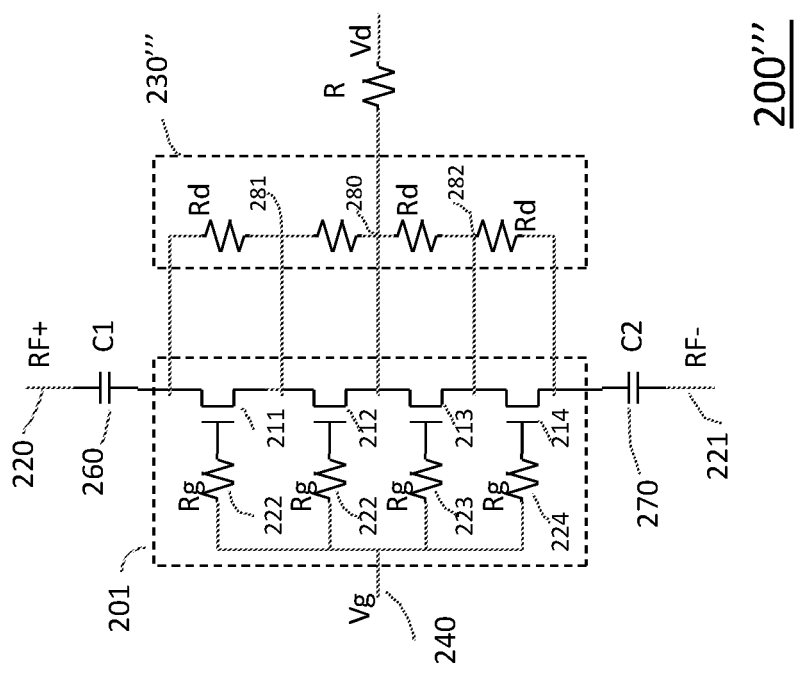

FIG. 2D shows an integrated circuit block 200''' according to a further embodiment of the present disclosure. Also shown in FIG. 2D is a resistive network 230''' comprising a plurality of resistors Rd, connected across the drain-source terminals of a corresponding switching FET. The supply voltage Vd is coupled to a node 280 of the resistive network 230" through a series resistance R, thereby providing bias voltages to the drain terminals of the stack switch. The person skilled in the art will understand that the supply voltage Vd may be connected to a different node of the resistive network 230" (for example node 281 or node 282).

Figure 3:
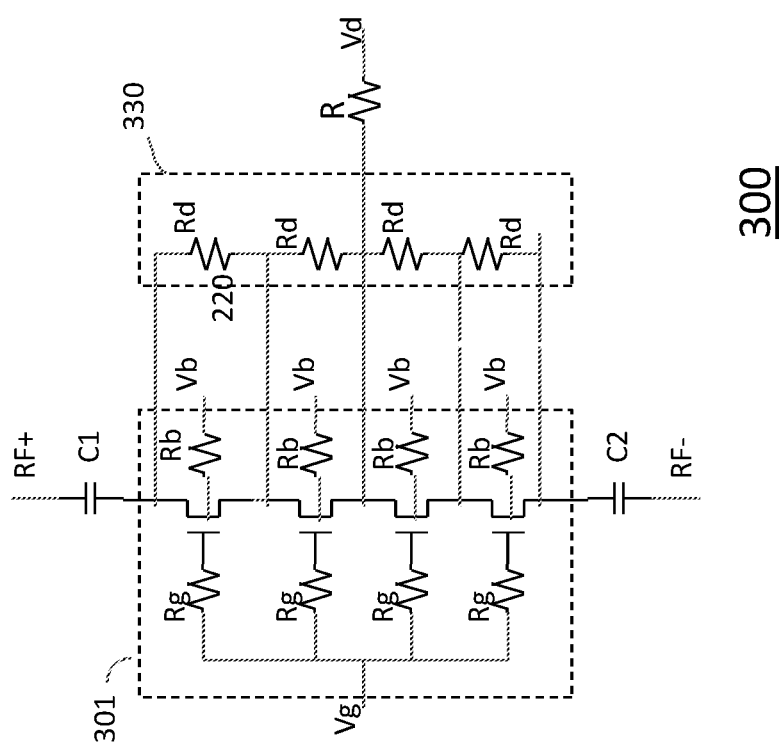
FIG. 3 shows an embodiment of the present disclosure using four terminal FET switches.

FIG. 3 shows an integrated circuit block 300 according to an embodiment of the disclosure. The DTC circuit 300 comprises a plurality of stacked four-terminal FET switches. As shown in FIG. 3, bodies of the plurality of the stacked four terminal FET switches are connected to a plurality of bias voltages Vb using a plurality of resistances Rb. In an embodiment of the disclosure, when the stack switch is in an OFF state, Vb=Vg=0V and Vd=+3V and when the switches are ON, Vb=Vd=0V and Vg=+3V. In accordance with another embodiment of the present disclosure, when the switches are OFF Vb=Vg=0V, Vd=+1.5V and in an ON state Vb=Vd=0V and Vg=+1.5V.

Figure 4A:
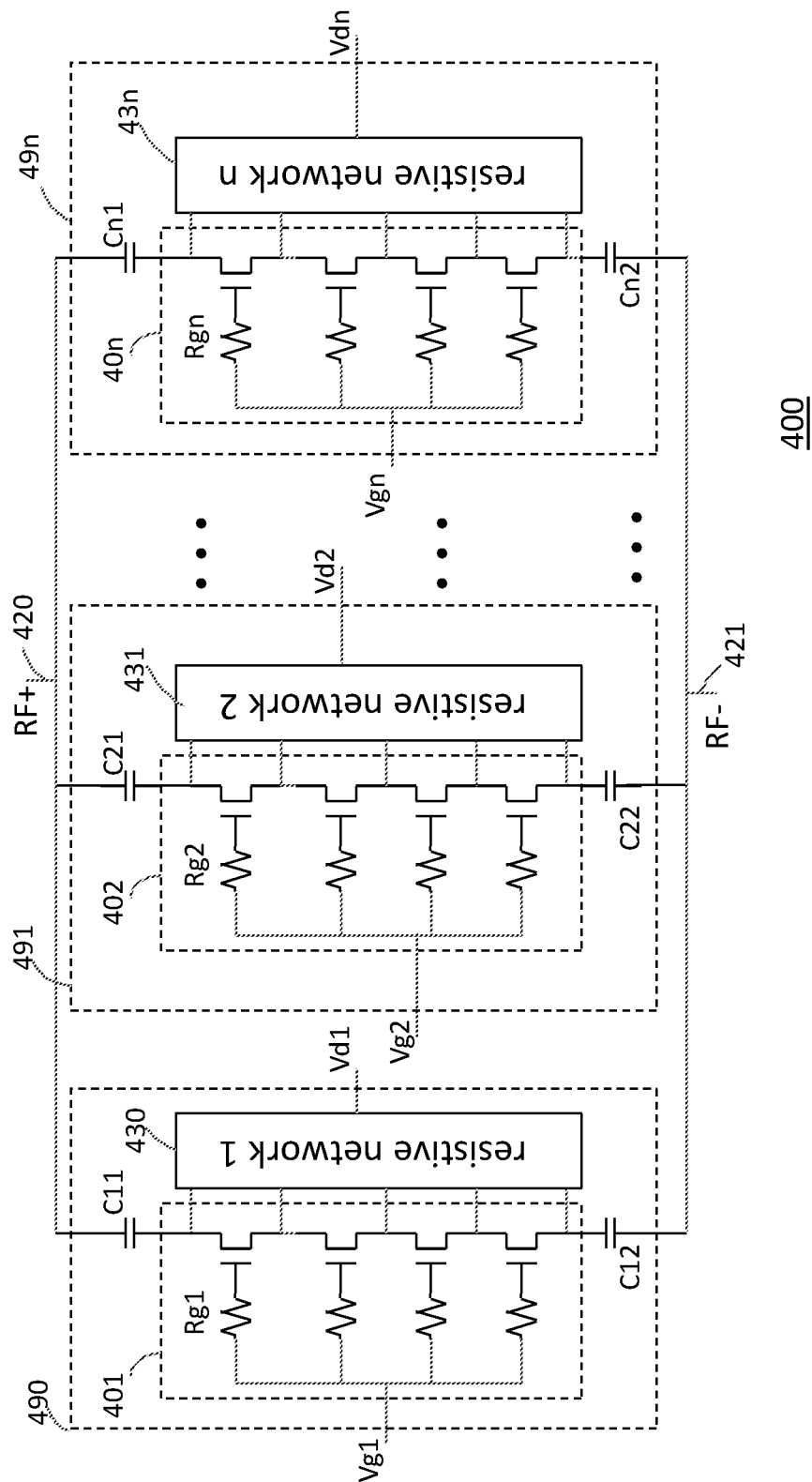
FIGS. 4A-4C show DTC circuits comprising resistive networks in accordance with additional embodiments of the present disclosure.

Turning back to the depiction of FIG. 2A, embodiments of the present disclosure may be made using a plurality of the circuit blocks 290 configured in parallel and in accordance of the teachings as disclosed in the PCT Patent International Application No. PCT/US2009/001358 filed Mar. 2, 2009, entitled "Method and Apparatus for use in Digitally Tuning a Capacitor in an Integrated Circuit Device" incorporated herein in its entirety. In what follows, examples of such implementations will be discussed. FIG. 4A shows an example where a DTC 400 is made in accordance with an embodiment of the disclosure and using the teachings of the above-incorporated patent documents. The DTC circuit 400 comprises a plurality of circuit blocks (e.g., circuit blocks 490, 491, ... and 49n) configured in parallel and coupled to two nodes RF+ (420) and RF− (421). The DTC circuit 400 further comprises a first plurality of supply voltages (e.g., Vg1, Vg2, ... and Vgn), a second plurality of supply voltages (e.g., Vd1, Vd2, ... and Vdn). Each circuit block comprises a plurality of stacked FET switches (e.g., stacked FET switches 401, 402, . . . and 40n) coupled in series with a first capacitor having a terminal connected to the node 420 (e.g., capacitors C11, C21, . . . and Cn1) and a second capacitor having a terminal connected to the node 421 (e.g., capacitors C12, C22, . . . and Cn2). Each stacked FET switch comprises a plurality of gate resistors (e.g., Rg) having first terminals coupled to gates of corresponding FETs and second terminals coupled to a corresponding supply voltage of the first plurality of supply voltages (e.g., Vg1, Vg2, . . . and Vgn). The plurality of circuit blocks further comprises a plurality of resistive networks (e.g., resistive networks 430, 431, . . . and 43n). Each resistive network is fed by a corresponding supply voltage of the second plurality of supply voltages (e.g., Vd1, Vd2 . . . and Vdn). Each resistive network is further coupled to drains of corresponding stacked FET switches and a source of the corresponding FET switch located at a bottom end of the corresponding stacked FET switches. Various implementations according to the methods disclosed in the above-incorporated patents may be used to come up with different embodiments of the disclosure. By way of example, weighting schemes in accordance with a binary code, thermometer code, a combination of the two or any other convenient and useful code may be envisaged.

Referring to FIG. 4A, in a preferred embodiment according to the present disclosure, the two capacitors in each circuit block have equal capacitance (e.g., C11 capacitance is equal to C12 capacitance, C21 capacitance is equal to C22 capacitance, . . . and Cn1 capacitance is equal to Cn2 capacitance). However, the person skilled in art will understand that embodiments wherein capacitances have all different values are also possible.

With further reference to FIG. 4A, although a preferred embodiment would comprise a plurality of same resistive networks in accordance with the present teaching, the person skilled in the art will also understand that other embodiments involving different types of resistive networks may also be made. In another preferred embodiment of the disclosure, the plurality of the circuit blocks would comprise a same number of switching FETs in their respective sub-circuits. However, a person skilled in the art will also appreciate that other embodiments may comprise a plurality of circuit blocks comprising each a different number of switching FETs. Generally speaking, the supply voltages as shown in FIG. 4A may all supply different voltage levels in some embodiment of the disclosure. However, a preferred embodiment in accordance with the present teachings may comprise a first plurality of supply voltages Vg1, Vg2, . . . and Vgn of same levels as well as a second plurality of supply voltages Vd1, Vd2, . . . and Vdn supplying equal voltage levels.

With continuous reference to FIG. 4A, in an embodiment according to the present disclosure, DC voltages on the nodes 420 and 421 are arbitrary and independent from the supply voltages Vg1, Vg2, . . . and Vgn, Vd1, Vd2, . . . and Vdn.

Figure 4B:
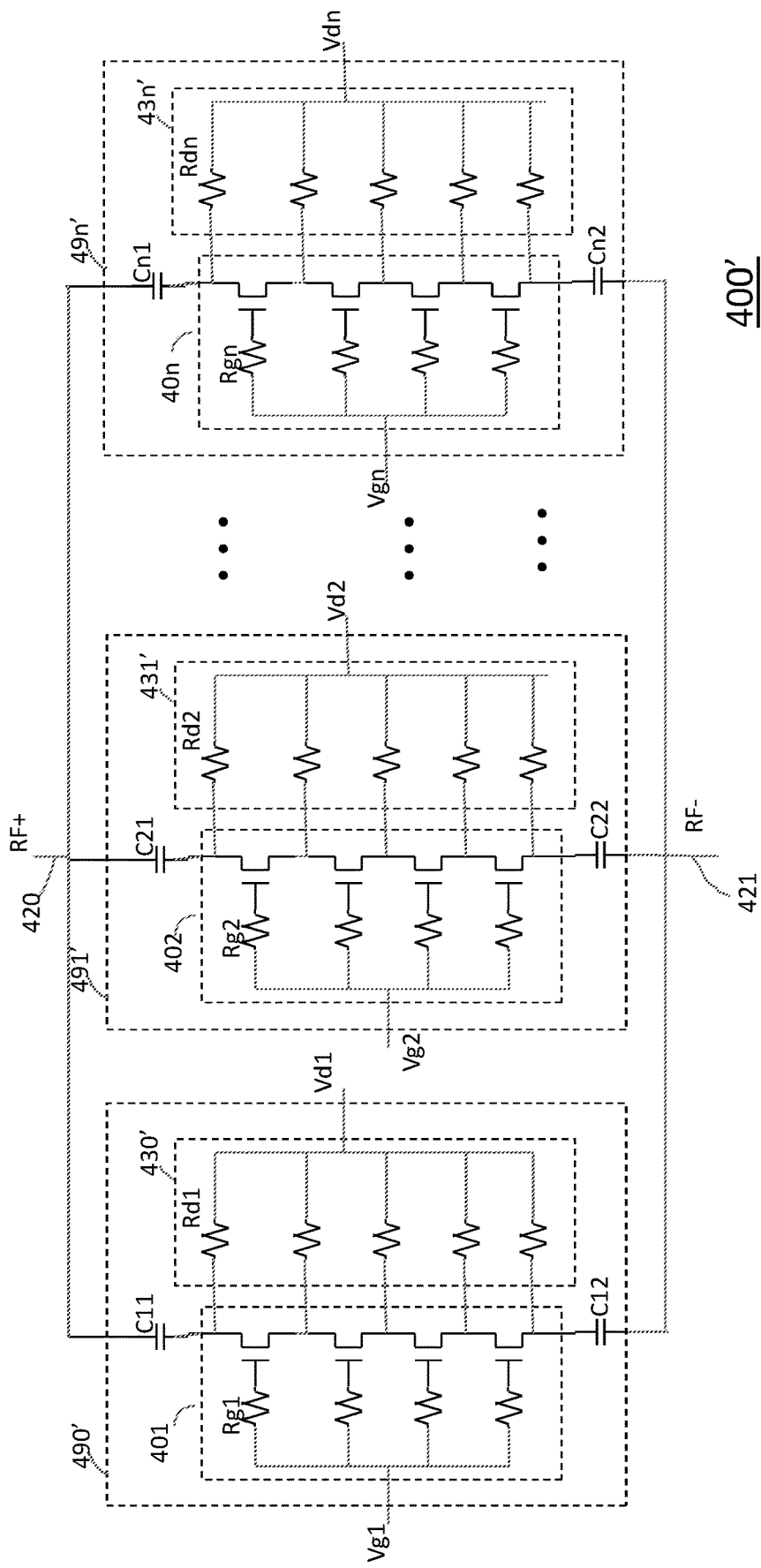

FIG. 4B shows a DTC circuit 400' according to an embodiment of the present disclosure. The DTC circuit 400' comprises a plurality of resistive networks (e.g., resistive networks 430', 431', . . . and 43n'). Each resistive network comprises a plurality of resistors having first terminals coupled to drains of corresponding FETs and second terminals coupled to the corresponding supply voltage of the plurality of second supply voltages (e.g., Vd1, Vd2, . . . and Vdn). Each resistive network further comprises a last resistor having a first terminal coupled to the corresponding supply voltage of the plurality of second supply voltage (e.g., Vd1, Vd2, . . . and Vdn) and a second terminal coupled with a source of the corresponding FET switch located at the bottom end of the corresponding stacked FET switches.

Figure 4C:
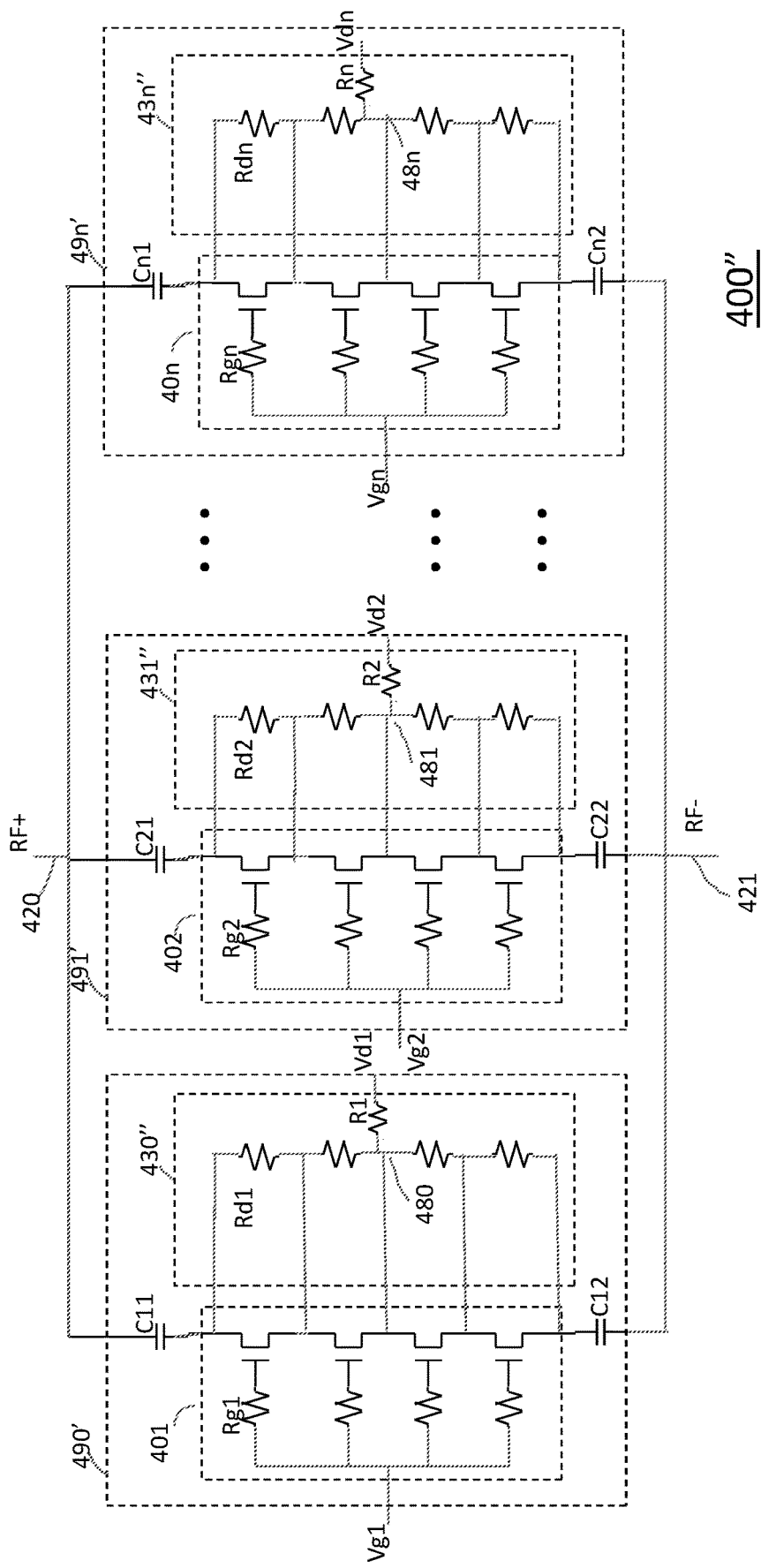

FIG. 4C shows a DTC circuit 400" in accordance with another embodiment of the present disclosure. The DTC circuit 400' comprises a plurality of resistive networks (e.g., resistive networks 430", 431", . . . and 43n"). Each resistive network comprises a plurality of resistors coupled across drains and sources of corresponding stacked FET switches. Furthermore, each resistive network is fed by a corresponding supply voltage of the second plurality of supply voltages through a series resistor of the resistive network (e.g., R1, R2, . . . and Rn).

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

Fabrication Technologies and Options

Although most embodiments described in the present disclosure use MOSFET devices, the person skilled in the art will understand that embodiments implementing the teachings of the disclosure may be envisaged wherein a device comprising three or more terminals is used. Such device further comprises a resistance between two terminals wherein the resistance is controlled by a third terminal.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

The term "MOSFET" technically refers to metal-oxide-semiconductors; another synonym for MOSFET is "MIS-FET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits. Further, as should be readily apparent to one of ordinary skill in the art, various embodiments of the invention may take into account the RF characteristics (e.g., distributed effects) of various components and may include additional circuit elements to adjust or compensate for such characteristics. For example, at high radio frequencies, a pure resistor cannot be readily implemented in actual ICs—an actual resistor will have some physical length which introduces effects other than resistance alone, such as parasitic capacitance and/or inductance. Similarly, actual inductive and capacitive elements may include a resistive characteristic and also exhibit distributed effects on other components. Accordingly, where resistive R, capacitive C, and inductive L components have been specified above, it should be understood that such components may be implemented by elements that are substantially resistive, substantially capacitive, and substantially inductive, respectively.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. An integrated circuit block comprising:
   a first node;
   a second node;
   a resistive network;
   a series arrangement of two or more capacitors and a plurality of FET switches coupled between the first node and the second node;
   supply rails providing a first supply rail voltage and a second supply rail voltage, and
   a first control voltage and a second control voltage;
   wherein:
      a first capacitor of the two or more capacitors is coupled to the first node and a second capacitor of the two or more capacitors is coupled to the second node;
      the plurality of FET switches comprises a first end FET switch and a second end FET switch, the first end FET switch being closest to the first node and farthest from the second node and the second end FET switch being closest to the second node and farthest from the first node;
      each FET switch comprises a gate resistor coupling a FET switch gate to the first control voltage;
      the resistive network coupling the FET switch sources of the plurality of FET switches and/or FET switch drains of the plurality of FET switches to the second control voltage;
      the first control voltage and the second control voltage are non-negative voltages configured to enable and disable the FET switches and thereby adjusting a capacitance between the first node and the second node, and
      the second control voltage is a constant mid rail voltage regardless of ON or OFF states of the plurality of FET switches.

2. The integrated circuit block of claim 1, wherein the mid rail voltage is at least one FET switch threshold voltage above the first supply voltage and at least one FET switch threshold voltage below the second supply voltage.

3. The integrated circuit block of claim 2, wherein the first control voltage is switched between the first supply rail voltage and the second supply rail voltage to facilitate switching of the FET switches to the ON or OFF states.

4. The integrated circuit block of claim 1, wherein at least one of drain and/or source of the plurality of FET switches is not directly connected to the resistive network.

5. The integrated circuit block of claim 1, wherein the plurality of FET switches are four terminal FETs, a body of the four terminal FETs being connected to ground.

6. The integrated circuit block of claim 1, wherein the plurality of FET switches are four terminal FETs, a body of the four terminal FETs being connected to a supply voltage through a plurality of resistors.

7. The integrated circuit block of claim 1, wherein the two or more capacitors have same capacitances.

8. The integrated circuit block of claim 1, wherein the first control voltage and the second control voltage are configured such that a voltage across gate-source terminals of the FET switches is smaller or equal to a maximum allowable voltage level.

9. A digitally tunable capacitor (DTC) circuit comprising:
   a plurality of the integrated circuit blocks of claim 1, wherein the plurality of integrated circuit blocks are configured in parallel.

10. The DTC of claim 9, wherein the first control voltage has a same first voltage level for each integrated circuit block of the plurality of integrated circuit blocks and the second control voltage has a same second voltage level for each integrated circuit block of the plurality of integrated circuit blocks.

11. The integrated circuit block of claim 1, wherein the plurality of resistors have same resistances.

12. The integrated circuit block of claim 1, wherein the plurality of FET switches comprises two or more FET switches configured to withstand a voltage greater than a voltage withstood by one switch.

13. The integrated circuit block of claim 1, wherein the non-negative control voltages are positive control voltages regardless of states of the plurality of FET switches.

14. The integrated circuit block of claim 1 implemented on a silicon-on-insulator (SOI) chip.

15. An integrated circuit comprising:
a first node;
a second node;
a series arrangement of two or more capacitors and a plurality of FET switches; the plurality of FET switches comprising a first end FET switch and a second end FET switch, the first end FET switch being the closest to the first node and farthest from the second node and the second end FET switch being closest to the second node and farthest from the first node, and each of the plurality of FET switches comprising a gate resistor;
a non-negative second supply voltage independent of a number of FET switches of the plurality of FET switches, the non-negative second supply voltage being a constant mid rail voltage;
a resistive network, the resistive network coupling the drains and/or sources of the plurality of FET switches to the second supply voltage regardless of ON and OFF states of the plurality of FET switches, and
a non-negative first supply voltage independent of a number of FET switches of the plurality of FET switches connecting the gate of each of the FET switches from the plurality of the FET switches to the first supply voltage via a corresponding gate resistor;
wherein:
the series arrangement of the two or more capacitors and the plurality of FET switches are coupled between the first and the second nodes;
a first capacitor and a second capacitor of the two or more capacitors are coupled to the first node and the second node respectively, and
the first and the second supply voltage are configured to enable or disable the FET switches to adjust a capacitance between the first node and the second node.

16. A method of digitally tuning a capacitor in an integrated circuit, the method comprising the steps of:
providing a first node;
providing a second node;
providing a series arrangement of two or more capacitors and a plurality of FET switches; the plurality of FET switches comprising a first end FET switch and a second end FET switch, the first end FET switch being the closest to the first node and farthest from the second node and the second end FET switch being closest to the second node and farthest from the first node, and each of the plurality of FET switches comprising a gate resistor;
providing a non-negative second supply voltage independent of a number of FET switches of the plurality of FET switches, the non-negative second supply voltage being a constant mid rail voltage;
providing a resistive network, the resistive network coupling the drains and/or sources of the plurality of FET switches to the second supply voltage regardless of ON and OFF states of the plurality of FET switches;
providing a non-negative first supply voltage independent of a number of FET switches of the plurality of FET switches connecting the gate of each of the FET switches from the plurality of the FET switches to the first supply voltage via a corresponding gate resistor;
coupling the series arrangement of two or more capacitors and the plurality of FET switches between the first node and the second node;
coupling a first capacitor of the two or more capacitors to the first node and coupling a second capacitor of the two or more capacitors to the second node; and
enabling or disabling the FET switches using the first supply voltage and the second supply voltage and thereby adjusting a capacitance between the first node and the second node.

17. A digitally tunable capacitor circuit comprising a plurality of integrated circuit blocks configured in parallel, wherein an integrated circuit block of the plurality of integrated circuit blocks comprises:
a first node;
a second node;
a resistive network;
a series arrangement of two or more capacitors and a plurality of FET switches coupled between the first node and the second node; and
supply rails providing a first supply voltage and a second supply voltage, the second supply voltage being a constant mid rail voltage;
wherein:
a first capacitor of the two or more capacitors is coupled to the first node and a second capacitor of the two or more capacitors is coupled to the second node;
the plurality of FET switches comprises a first end FET switch and a second end FET switch, the first end FET switch being closest to the first node and farthest from the second node and the second end FET switch being closest to the second node and farthest from the first node;
each FET switch comprises a gate resistor connecting a FET switch gate to the first supply voltage;
the first supply voltage and the second supply voltage are non-negative supply voltages configured to enable and disable the FET switches and thereby adjusting a capacitance between the first node and the second node; and
the resistive network comprises a plurality of resistors having first terminals connected to drains of corresponding FET switches and second terminals connected to the second supply voltage, the resistive network further comprising an end resistor connecting a source of the second end FET switch to the second supply voltage.

* * * * *